(12) United States Patent
Park et al.

(10) Patent No.: US 8,766,411 B2
(45) Date of Patent: *Jul. 1, 2014

(54) FILLER FOR FILLING A GAP, METHOD OF PREPARING THE SAME AND METHOD OF MANUFACTURING SEMICONDUCTOR CAPACITOR USING THE SAME

(75) Inventors: Eun-Su Park, Uiwang-si (KR);
Bong-Hwan Kim, Uiwang-si (KR);
Sang-Hak Lim, Uiwang-si (KR);
Taek-Soo Kwak, Uiwang-si (KR);
Jin-Hee Bae, Uiwang-si (KR);
Hui-Chan Yun, Uiwang-si (KR);
Sang-Kyun Kim, Uiwang-si (KR);
Jin-Wook Lee, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/548,519

(22) Filed: Jul. 13, 2012

(65) Prior Publication Data

US 2013/0017662 A1    Jan. 17, 2013

(30) Foreign Application Priority Data

Jul. 15, 2011    (KR) .................. 10-2011-0070672

(51) Int. Cl.
*H01L 23/58*    (2006.01)
(52) U.S. Cl.
USPC .................. 257/642; 257/E29.015; 438/780; 428/845; 525/940
(58) Field of Classification Search
USPC ........... 257/642, E29.015; 438/780; 428/845; 525/940
See application file for complete search history.

(56) References Cited

U.S. PATENT DOCUMENTS

| 5,145,812 | A  | * | 9/1992  | Arai et al. ..................... 501/96.2 |
| 5,196,387 | A  | * | 3/1993  | Ayama et al. ................... 501/89 |
| 5,922,411 | A  | * | 7/1999  | Shimizu et al. ............ 427/397.7 |
| 6,562,465 | B1 | * | 5/2003  | Nakashima et al. .......... 428/412 |
| 8,058,711 | B2 | * | 11/2011 | Lim et al. ..................... 257/642 |
| 2003/0045635 | A1 |  | 3/2003 | Lukaes |
| 2007/0281495 | A1 | * | 12/2007 | Mallick et al. ................ 438/778 |
| 2008/0090988 | A1 | * | 4/2008 | Nakazawa et al. ............. 528/31 |
| 2009/0305063 | A1 |  | 12/2009 | Hayashi |

(Continued)

FOREIGN PATENT DOCUMENTS

| CN | 1061419 A | 5/1992 |
| CN | 101528974 A | 9/2009 |

(Continued)

OTHER PUBLICATIONS

Qi et al., "Synthesis, Characterization of Perhydropolysilazane and Its Application in the Preparation of 3D SiO2/Si3N4 composites", Key Engineering Materials vols. 336-338 (2007), pp. 1233-1235.*

(Continued)

*Primary Examiner* — Marvin Payen
*Assistant Examiner* — Victor Barzykin
(74) *Attorney, Agent, or Firm* — Lee & Morse, P.C.

(57) ABSTRACT

A filler for filling a gap includes a compound represented by the following Chemical Formula 1.

$Si_aN_bO_cH_d$.    [Chemical Formula 1]

In Chemical Formula 1, a, b, c, and d represent relative amounts of Si, N, O, and H, respectively, in the compound, $1.96 < a < 2.68$, $1.78 < b < 3.21$, $0 \leq c < 0.19$, and $4 < d < 10$.

8 Claims, 5 Drawing Sheets

(56) References Cited

U.S. PATENT DOCUMENTS

| | | | |
|---|---|---|---|
| 2010/0323168 A1* | 12/2010 | Nagahara et al. | 428/172 |
| 2011/0129981 A1* | 6/2011 | Lim et al. | 438/381 |
| 2011/0136347 A1* | 6/2011 | Kovarsky et al. | 438/758 |
| 2012/0164382 A1* | 6/2012 | Yun et al. | 428/141 |
| 2012/0177829 A1* | 7/2012 | Lim et al. | 427/377 |
| 2013/0017662 A1* | 1/2013 | Park et al. | 438/381 |

FOREIGN PATENT DOCUMENTS

| | | |
|---|---|---|
| EP | 0890599 A1 | 1/1999 |
| JP | 63-309527 | 12/1988 |
| JP | 01-203430 | 8/1989 |
| JP | 04-063833 | 2/1992 |
| JP | 06-299118 | 10/1994 |
| JP | 2001-308090 | 11/2001 |
| JP | 2006253310 A * | 9/2006 |
| JP | 2010177647 A * | 8/2010 |
| KR | 1993-7000971 A | 3/1993 |
| KR | 10-2000-0006436 A | 1/2000 |
| KR | 10-2007-0086999 A | 8/2007 |
| KR | 10-2011-0043994 A | 4/2011 |
| KR | 10-2011-0062158 A | 6/2011 |
| WO | WO 91/19317 A1 | 12/1991 |
| WO | WO-2008/029834 | 3/2008 |

OTHER PUBLICATIONS

Chinese Office Action dated Jan. 21, 2014.

* cited by examiner

FILLER FOR FILLING A GAP, METHOD OF PREPARING THE SAME AND METHOD OF MANUFACTURING SEMICONDUCTOR CAPACITOR USING THE SAME

CROSS-REFERENCE TO RELATED APPLICATION

This application claims priority under U.S.C. §119 to Korean Patent Application No. 10-2011-0070672 filed in the Korean Intellectual Property Office on Jul. 15, 2011, the entire contents of which are incorporated herein by reference.

BACKGROUND

1. Field

This disclosure relates to filler for filling a gap, a method of preparing the same, and a method of manufacturing a semiconductor capacitor using the same.

2. Description of the Related Art

As semiconductor technology is increasingly developed, there is continuous research on forming highly-integrated and faster semiconductor memory cells that have improved performance and integrate smaller semi-conductor chips. Particularly, these semiconductor memory cells, e.g., dynamic random access memory (DRAM) may be used. The DRAM is capable of freely inputting and outputting information, and may realize large capacity.

The DRAM may include, e.g., a plurality of unit cells including one MOS transistor (MOS transistor) and one capacitor. The capacitor may include two electrodes and a dielectric layer disposed therebetween. The capacity of the capacitor may depend on a dielectric constant, a thickness of the dielectric layer, an area of the electrodes, or the like.

As a size of a semiconductor chip is reduced, the size of the capacitor therein may also be reduced. However, it is desirable for a smaller capacitor to have a sufficient storage capacity. A bigger capacity may be obtained by increasing the vertical area of the capacitor to increase overall active area.

SUMMARY

Embodiments are directed to a filler for filling a gap including a compound represented by the following Chemical Formula 1 is provided.

   [Chemical Formula 1]

In the above Chemical Formula 1,
a, b, c, and d represent relative amounts of Si, N, O, and H, respectively, in the compound,
$1.96 < a < 2.68$,
$1.78 < b < 3.21$,
$0 \leq c < 0.19$, and
$4 < d < 10$.

The compound represented by Chemical Formula 1 may have a weight average molecular weight of about 1,000 to about 30,000.

The compound represented by Chemical Formula 1 may include nitrogen atoms and silicon atoms at a mole ratio (N/Si) of about 0.7 to about 0.95.

The compound represented by Chemical Formula 1 may include —$SiH_e$ (wherein, e is an integer of 1 to 3). In the compound represented by Chemical Formula 1 including —$SiH_e$, a ratio of —$SiH_3$ of to a total of —$SiH_e$ based on a total number of hydrogen atoms may be about 0.35 to about 0.85.

Embodiments are also directed to a method of preparing a filler for filling a gap, the method including reacting a compound selected from the group of hydrogenated polysilazane, hydrogenated polysiloxazane, and a combination thereof, with trisilylamine (($SiH_3$)$_3$N).

Embodiments are also directed to a method of manufacturing a semiconductor capacitor that includes forming a mold with a gap on a semiconductor substrate; forming a conductive layer on the semiconductor substrate and the mold; applying a filler material in the gap and on the conductive layer to form a filler layer; heat-treating the filler layer to form silica in the filler layer; developing a part of the filler layer filled in the gap to form a filler pattern; removing a part of the conductive layer to form the first electrode; removing the mold and the filler pattern; forming a dielectric layer on the first electrode; and forming a second electrode on the dielectric layer, wherein the filler, before the heat treating of the filler layer, includes the compound represented by the following Chemical Formula 1.

$$Si_aN_bO_cH_d \qquad \text{[Chemical Formula 1]}$$

In Chemical Formula 1,
a, b, c, and d represent relative amounts of Si, N, O, and H, respectively, in the compound,
$1.96 < a < 2.68$,
$1.78 < b < 3.21$,
$0 \leq c < 0.19$, and
$4 < d < 10$.

The compound represented by Chemical Formula 1 may have a weight average molecular weight of about 1,000 to about 30,000.

The compound represented by Chemical Formula 1 may include nitrogen atoms and silicon atoms at a mole ratio (N/Si) of about 0.7 to about 0.95.

The compound represented by Chemical Formula 1 may include —$SiH_e$ (wherein, e is an integer of 1 to 3). In the compound represented by Chemical Formula 1 including —$SiH_e$, a ratio of —$SiH_3$ to a total of —$SiH_e$ based on a total number of hydrogen atoms may be about 0.35 to about 0.85.

The heat-treating of the filler layer to form silica in the silica layer may include drying the filler layer at a temperature of about 50° C. to about 200° C., and heat-treating the filler layer under an oxygen atmosphere including vapor of greater than or equal to about 0.1 kPa at a temperature of about 200° C. to about 1,000° C.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
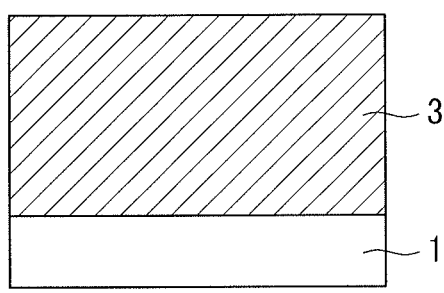
FIGS. 1 to 9 illustrate cross-sectional views sequentially showing stages of a method of manufacturing a semiconductor capacitor according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, the term "substituted" may refer to one substituted with at least one selected from a substituent selected from a halogen (F, Br, Cl, or I), a hydroxy group, a nitro group, a cyano group, an imino group (=NH, =NR, wherein R is a C1 to C10 alkyl group), an amino group (—NH₂, —NH(R'), —N(R")(R'"), wherein R' to R'" are each independently a C1 to C10 alkyl group), an amidino group, a hydrazine or hydrazone group, a carboxyl group, a C1 to C10 alkyl group, a C6 to C20 aryl group, a C3 to C20 cycloalkyl group, a C1 to C10 heteroalkyl group, a C3 to C20 heteroaryl group, and a C2 to C20 heterocycloalkyl group, instead of a hydrogen atom in a functional group; at least one selected from a substituent selected from =O, =S, =NR (wherein R is a C1 to C10 alkyl group), =PR (wherein R is a C1 to C10 alkyl group), and =SiRR' (wherein R and R' is independently a C1 to C10 alkyl group) instead of two hydrogen atoms; or one substituted with a substituent selected from ≡N, ≡P, and ≡SiR (R is a C1 to C10 alkyl group) instead of three hydrogen atoms.

As used herein, when a definition is not otherwise provided, the term "combination" may refer to a mixture or a copolymer. The term "copolymerization" may refer to block copolymerization, random copolymerization, or the like, and the term "copolymer" may refer to a block copolymer, a random copolymer, or the like.

The filler for filling a gap according to one embodiment includes a compound represented by the following Chemical Formula 1.

$$Si_aN_bO_cH_d \quad \text{[Chemical Formula 1]}$$

In Chemical Formula 1,
a, b, c, and d represent relative amounts of Si, N, O, and H, respectively, in the compound,
1.96<a<2.68,
1.78<b<3.21,
0≤c<0.19, and
4<d<10.

The compound represented by the above Chemical Formula 1 may be a hydrogenated polysilazane-based compound when c is zero. The compound represented by the above Chemical Formula 1 may be a hydrogenated polysiloxazane-based compound when c is not zero.

In general, the hydrogenated polysilazane or hydrogenated polysiloxazane may be converted into a silica layer in a reaction with oxygen or vapor that produces $SiO_2$, ammonia, and hydrogen.

The hydrogenated polysilazane and hydrogenated polysiloxazane produce $SiO_2$ and $NH_3$ in the reaction, which may cause a weight decrease and shrinkage of the formed silica layer. Accordingly, if a produced amount of $NH_3$ can be decreased, the weight decrease, that is shrinkage may be reduced or prevented during the conversion into a silica layer. The $NH_3$ may be produced from the nitrogen of the hydrogenated polysilazane and hydrogenated polysiloxazane. Thus, when an amount of nitrogen relative to silicon of the hydrogenated polysilazane and hydrogenated polysiloxazane decreases, the produced amount of $NH_3$ may be decreased.

In one embodiment, trisilylamine including one nitrogen atom and three silicon atoms and without organic components may be reacted with hydrogenated polysilazane or hydrogenated polysiloxazane, and thus, a relative amount of nitrogen to silicon may be decreased. The hydrogenated polysilazane-based compound and hydrogenated polysiloxazane-based compound represented by the above Chemical Formula 1 that is modified by the above reaction may reduce a film shrinkage during conversion into a silica layer through heating, compared with a conventional hydrogenated polysilazane and hydrogenated polysiloxazane.

The compound represented by the above Chemical Formula 1 may have a weight average molecular weight ($M_w$) of about 1,000 to about 30,000. When the compound represented by the above Chemical Formula 1 has a weight average molecular weight within the above range, a uniform film may be obtained when applying the compound onto a substrate. Due to an appropriate viscosity, an amount of components having a low molecular weight that may be evaporated during heat-treating may be reduced, a trench having a narrow width may be filled stably, and there a possibility of causing gelation may be reduced.

When the compound represented by the above Chemical Formula 1 includes nitrogen atoms and silicon atoms in a mole ratio (N/Si) of about 0.7 to about 0.95, film shrinkage may be remarkably reduced during the conversion into a silica layer.

The compound represented by the above Chemical Formula 1 may be included in an amount of about 0.1 wt % to about 50 wt % based on a total amount of the filler for filling a gap. When the compound represented by the above Chemical Formula 1 is included within the range, an appropriate viscosity may be obtained and a flat and uniform silica layer may be formed, without voids being formed during the gap-filling.

The filler for filling a gap may further include a thermal acid generator (TAG).

The thermal acid generator may be an additive to improve developability of the compound represented by the above Chemical Formula 1. The compound represented by the above Chemical Formula 1 may be developed at a relatively low temperature.

The thermal acid generator may include any suitable compound that generates acid ($H^+$) by heat. In particular, the thermal acid generator may include a compound that is activated at 90° C. or higher and generates sufficient acid and also, has a low volatility. Such a thermal acid generator may include, for example, nitrobenzyl tosylate, nitrobenzyl benzenesulfonate, phenol sulfonate, or a combination thereof.

The thermal acid generator may be included in an amount of about 0.01 wt % to about 25 wt % based on the total amount of the filler for filling a gap. When the thermal acid generator is included within this range, the compound represented by the above Chemical Formula 1 may be developed at a relatively low temperature, and simultaneously, may have improved coating property.

The filler may further include a surfactant.

The surfactant may include, for example, a non-ion-based surfactant of polyoxyethylene alkyl ethers such as polyoxyethylene lauryl ether, polyoxyethylene stearyl ether, polyoxyethylene cetyl ether, polyoxyethylene oleyl ether, or the like, polyoxyethylene alkylallyl ethers such as polyoxyethylene nonylphenolether, or the like, polyoxyethylene ·polyoxypropylene block copolymers, polyoxyethylene sorbitan fatty acid ester such as sorbitan monolaurate, sorbitan monopalmitate, sorbitan monostearate, sorbitan monooleate, polyoxyethylene sorbitan monostearate, polyoxyethylene sorbitan trioleate, polyoxyethylene sorbitan tristearate, or the like, fluorine-based surfactant EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), ASAHI GUARD AG710, SURFLON S-382, SC101, SC102, SC103, SC104, SC105, SC106(Asahi Glass Co., Ltd.), or the like, or other silicone-based surfactants such as a organosiloxane polymer KP341(Shin-Etsu Chemical Co., Ltd.), or the like.

The surfactant may be included in an amount of about 0.001 to about 10 wt % based on the total amount of the filler for filling a gap. When the surfactant is included within this range, dispersion of a solution may be improved and simultaneously, a uniformity of thickness of a layer and filling properties may be improved.

Components of the filler for filling a gap may be dissolved in an organic solvent to provide a solution.

The organic solvent may be any suitable compound for dissolving the components. Examples of the solvent include, for example, alcohols such as methanol, ethanol, or the like; dichloroethyl ether, n-butyl ether, diisoamyl ether, methylphenyl ether, tetrahydrofuran, or the like; glycol ethers such as ethylene glycol monomethylether, ethylene glycol monoethylether, or the like; cellosolve acetates such as methyl cellosolve acetate, ethyl cellosolve acetate, diethyl cellosolve acetate, or the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, or the like; propylene glycol alkylether acetates such as propylene glycol methylether acetate, propylene glycol propylether acetate, or the like; aromatic hydrocarbons such as toluene, xylene, or the like; ketones such as methylethylketone, cyclohexanone, 4-hydroxy-4-methyl-2-pentanone, methyl-n-propylketone, methyl-n-butylketone, methyl-n-amylketone, 2-heptanone, or the like; saturated aliphatic monocarboxylic acid alkyl esters such as ethyl acetate, n-butyl acetate, isobutyl acetate, or the like; lactic acid esters such as methyl lactate, ethyl lactate, or the like; oxy acetic acid alkyl esters such as oxy methyl acetate, oxy ethyl acetate, oxy butyl acetate, or the like; alkoxy acetic acid alkyl esters such as methoxy methyl acetate, methoxy ethyl acetate, methoxy butyl acetate, ethoxy methyl acetate, ethoxy ethyl acetate, or the like; 3-oxy propionic acid alkylesters such as 3-oxy methyl propionate, 3-oxy ethyl propionate, or the like; 3-alkoxy propionic acid alkyl esters such as 3-methoxy methyl propionate, 3-methoxy ethyl propionate, 3-ethoxy ethyl propionate, 3-ethoxy methyl propionate, or the like; 2-oxy propionic acid alkyl esters such as 2-oxy methyl propionate, 2-oxy ethyl propionate, 2-oxy propyl propionate, or the like; 2-alkoxy propionic acid alkyl esters such as 2-methoxy methyl propionate, 2-methoxy ethyl propionate, 2-ethoxy ethyl propionate, 2-ethoxy methyl propionate, or the like; 2-oxy-2-methyl propionic acid esters such as 2-oxy-2-methyl methyl propionate, 2-oxy-2-methyl ethyl propionate, or the like, monooxy monocarboxylic acid alkyl esters of 2-oxy-2-methyl propionic acid esters such as 2-methoxy-2-methyl methyl propionate, 2-ethoxy-2-methyl ethyl propionate, or the like; esters such as 2-hydroxy ethyl propionate, 2-hydroxy-2-methyl ethyl propionate, hydroxy ethyl acetate, 2-hydroxy-3-methyl methyl butanoate, or the like; ketone acid esters such as ethyl pyruvate, or the like. In addition, the organic solvent may include a solvent with a high boiling point, such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzyl alcohol, benzyl acetate, ethyl benzoate, diethyl oxalate, diethyl malate, γ-butyrolactone, carbonate ethylene, carbonate propylene, phenyl cellosolve acetate, or the like. Of these solvents, according to an implementation, diethyl eneglycol monomethylether, diethyleneglycol diethylether, ethyl-3-ethoxy propionate, methyl-3-methoxy propionate, cyclopentanone, cyclohexanone, propyleneglycol monomethyletheracetate, propyleneglycol dimethyletheracetate, 1-methoxy-2-propanol, ethyl lactate, cyclopentanone, or ethyl hydroxyl acetate may be selected.

At least one of the organic solvents may have a high boiling point. The solvent with a high boiling point may prevent the generation of a void when the gap is filled. The high boiling point organic solvent also may increase the layer flatness, since the high boiling point organic solvent may be slowly volatilized.

The organic solvent may be included as a balance except for the aforementioned components based on the total amount of the filler for filling a gap.

According to an embodiment, a method of preparing a filler for filling a gap may include reacting a compound selected from the group of hydrogenated polysilazane, hydrogenated polysiloxazane, and a combination thereof with trisilylamine $((SiH_3)_3N)$.

The reaction of the hydrogenated polysilazane or hydrogenated polysiloxazane with trisilylamine may be performed by heating in an organic solvent. When the organic solvent is a basic solvent such as pyridine, or the like, the reaction may be carried out quickly. However, when moisture or alcohols, or the like, are present, such contaminants may have a bad influence on the reaction of the hydrogenated polysilazane or hydrogenated polysiloxazane with trisilylamine due to a hydrolysis or addition reaction of an alkoxy group. Accordingly, it is desirable that the organic solvent be sufficiently dehydrated and purified.

The reaction temperature may be in a range of about 0° C. to about 200° C. and specifically about 40° C. to about 120° C. in terms of a reaction rate and reaction control. The hydrogenated polysilazane or hydrogenated polysiloxazane may have an increased molecular weight due to the addition reaction and due to a cross-linking reaction with trisilylamine before and after the reaction. The reaction is caused by a dehydrogenation bond between an N—H group of the hydrogenated polysilazane or hydrogenated polysiloxazane and a Si—H group of the trisilylamine. Accordingly, hydrogen gas or the like may be produced, and thus, the pressure may be increased.

The molecular weight of the hydrogenated polysilazane or hydrogenated polysiloxazane may be increased due to addition reaction and a cross-linking reaction with the trisilylamine. Accordingly, the hydrogenated polysilazane or hydrogenated polysiloxazane may have a weight average molecular weight in a range of about 500 to about 15,000. Moreover, a ratio of —$SiH_3$ to a total of $SiH_e$ (where e is an integer of 1 to 3) in the hydrogenated polysilazane or hydrogenated polysiloxazane may be increased.

According to an embodiment, a method of manufacturing a semiconductor capacitor may include forming a mold with a gap on a semiconductor substrate; forming a conductive layer on the semiconductor substrate and the mold; applying a filler in the gap and on the conductive layer to form a filler layer; heat-treating the filler layer to form a silica layer; developing a part of the filler layer filled in the gap to form a filler pattern; removing a part of the conductive layer to separate the conductive layer into a plurality of the first electrode; removing the mold and the filler pattern; forming a dielectric layer on the first electrode; and forming a second electrode on the dielectric layer. The filler includes the compound represented by the following Chemical Formula 1.

 [Chemical Formula 1]

$$Si_aN_bO_cH_d$$

In Chemical Formula 1, a, b, c, and d represent relative amounts of Si, N, O, and H, respectively, in the compound, 1.96<a<2.68,
1.78<b<3.21,
0≤c<0.19,
4<d<10.

The filler for filling a gap may be used in the fabrication of an electrode when a semiconductor capacitor is fabricated. In particular, the filler may be used to fill a gap in a mold used to fabricate an electrode.

Hereinafter, referring to FIGS. 1 to 9, a method of manufacturing a semiconductor capacitor according to an embodiment is illustrated.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIGS. 1 to 9 are cross-sectional views sequentially showing the method of manufacturing a semiconductor capacitor according to an embodiment.

Referring to FIG. 1, a mold oxide layer 3 may be disposed on a semiconductor substrate 1. On the semiconductor substrate 1, a transistor (not shown), a contact pad (not shown), a contact plug (not shown), or the like, may be disposed. The mold oxide layer 3 may be made of, for example, an oxide such as silicon oxide ($SiO_2$), tetraethylortho silicate (TEOS), boron phosphorus silicate glass (BPSG), or phosphor silicate glass (PSG). The mold oxide layer 3 may be formed by a chemical vapor deposition (CVD) method, as an example.

Figure 2:
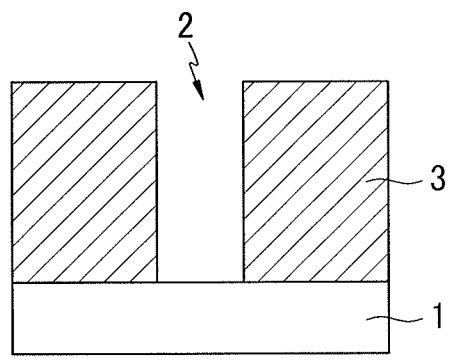

Referring to FIG. 2, the mold oxide layer 3 may be patterned by photolithography to form a gap 2 revealing a contact plug of the semiconductor substrate 1. The gap 2 may have a width that is not more than 50 nm and may have an aspect ratio (ratio of height and width) of not less than 1.

Figure 3:
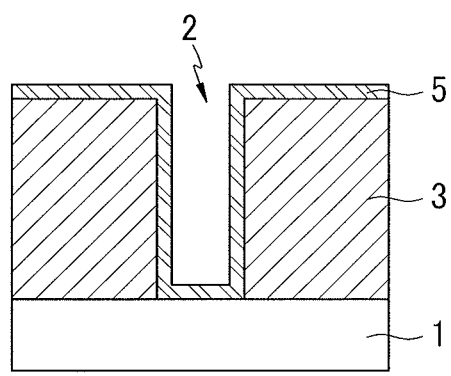

Referring to FIG. 3, a conductive layer 5 may be laminated on the semiconductor substrate 1 and the mold oxide layer 3. The conductive layer 5 may be a single layer or multilayer. The conductive layer may be made of, for example, a metal with low resistivity such as aluminum (Al), copper (Cu), silver (Ag), or an alloy thereof, a metal such as nickel (Ni), titanium (Ti), or the like, or polysilicon, or the like. The conductive layer 5 may be formed by a sputtering or chemical vapor deposition (CVD) method, or the like.

Figure 4:
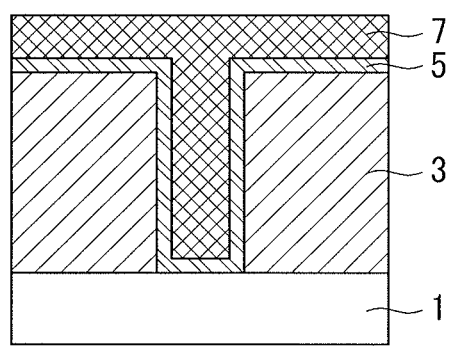

Referring to FIG. 4, a filler layer 7 is disposed on the conductive layer 5. The filler layer 7 may be a silica layer made from a filler for filling a gap, the filler including the compound represented by the above Chemical Formula 1.

The filler may be a solution prepared by mixing the compound represented by the above Chemical Formula 1 with a solvent. The filler may be applied by a solution process such as spin coating, slit coating, or the like.

Subsequently, the filler layer 7 may be heat-treated.

The heat-treating of the filler layer to form a silica layer may include drying the filler layer at a temperature of about 50° C. to about 200° C., and heat-treating the filler layer under an oxygen atmosphere including vapor of greater than or equal to about 0.1 kPa at a temperature of about 200° C. to about 1,000° C.

The drying may be performed to remove a solvent in the filler layer 7, and may be performed at a temperature of about 50° C. to about 200° C., for about 5 seconds to about 10 minutes. The drying may be performed under a general atmosphere including nitrogen, oxygen, vapor, or the like. When the drying is performed at a temperature of about 50° C. to about 200° C., the solvent may be removed sufficiently, and an oxidation reaction may avoided. When the drying temperature is about 5 seconds to about 10 minutes, time control may be easy, an oxidation reaction may be avoided, and the productivity may be good.

Through the heat-treating, the modified hydrogenated polysilazane or the modified hydrogenated polysiloxazane may be converted to silica. The heat-treating may be performed at a temperature of about 200° C. to about 1,000° C., for about 1 minute to about 3 hours.

The heat-treating may be performed under an oxygen atmosphere including vapor of greater than or equal to about 0.1 kPa, which may be diluted with inert gases such as nitrogen or argon gases. When the heat-treating is performed at about 200° C. to about 1,000° C., conversion into silica may be carried out sufficiently, and oxidation damage for a substrate does not occur. Oxidative gases may be desirable for oxidation of the modified hydrogenated polysilazane or the modified hydrogenated polysiloxazane, since inert gas by itself may not be sufficient to convert the modified hydrogenated polysilazane or the modified hydrogenated polysiloxazane into silica. When the heat-treating is carried out for about 1 minute to about 3 hours, controls for temperature, atmosphere gases, or the like may be easy to control in a cure furnace. Accordingly, oxidation damage of a substrate may be avoided, and the productivity may be good.

Figure 5:
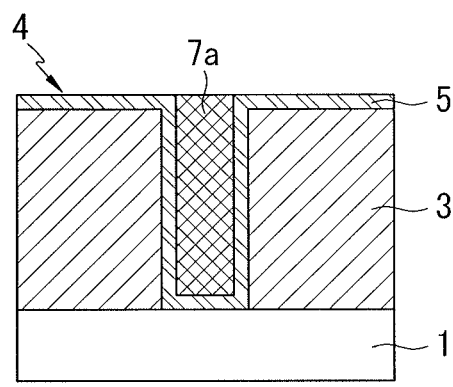

Referring to FIG. 5, the filler layer 7 may be developed using a developing solution. Accordingly, the filler layer 7 disposed on the conductive layer 5 may be removed, leaving a part filling the gap 2 and forming a predetermined filler pattern 7a.

Figure 6:
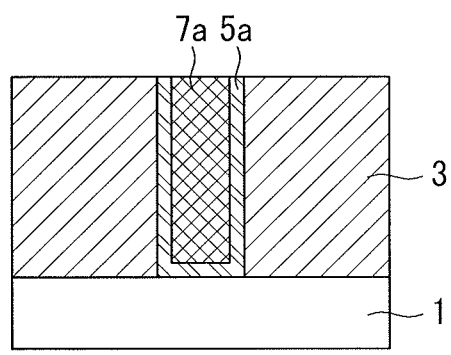

Referring to FIG. 6, the conductive layer 5 disposed on the mold oxide layer 3 may be removed, leaving a portion between the mold oxide layer 3 and the filler pattern 7a to provide a lower electrode 5a with a predetermined shape. The lower conductive layer 5 may be removed by a chemical mechanical polishing (CMP) method or an etch back method.

Figure 7:
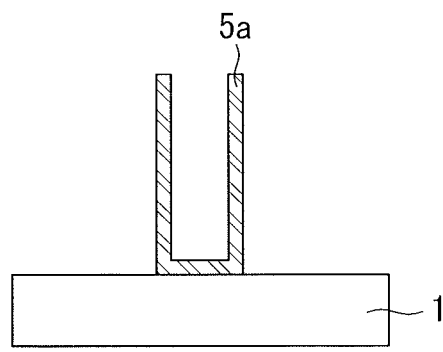

Referring to FIG. 7, the mold oxide layer 3 and the filler pattern 7a may be simultaneously removed, leaving a lower electrode 5a. The mold oxide layer 3 and the filler pattern 7a may be removed by a wet etching method. The wet etching may be carried out with any suitable material that may simultaneously remove the mold oxide layer 3 and the filler pattern 7a. For example, the wet etching material may include a fluorine-containing etching solution such as hydrofluoric acid (HF) and ammonium fluoride ($NH_4F$).

Figure 8:
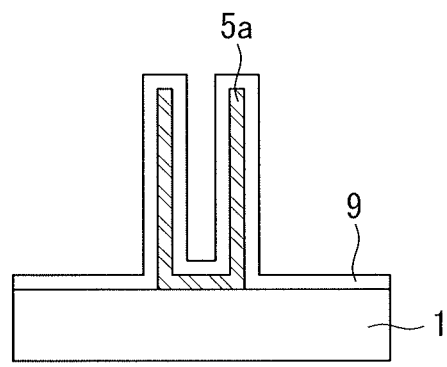

Referring to FIG. 8, a dielectric layer 9 may be disposed on an entire surface of a substrate including a lower electrode 5a.

Figure 9:
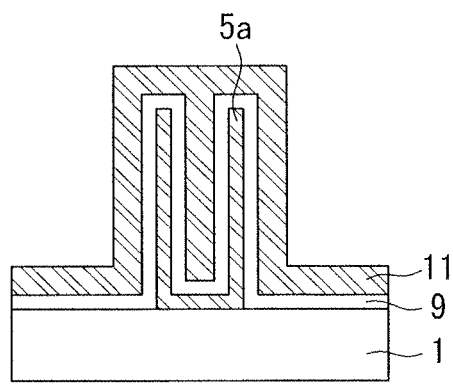

Referring to FIG. 9, an upper electrode 11 is formed by laminating a conductive layer on the dielectric layer 9 and then, patterning the conductive layer by photolithography.

The lower electrode 5a, the dielectric layer 9, and the upper electrode 11 form a capacitor.

The filler for filling a gap as disclosed herein may also be applied to gap-filling for STI or ILD processes.

The following Examples and Comparative Examples are provided in order to set forth particular details of one or more embodiments. However, it is to be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Preparation of Filler for Filling a Gap

Comparative Example 1

Dry nitrogen was filled inside a 2L reactor with an agitator and a temperature controller. 1,500 g of dry pyridine was injected in the reactor and maintained at 5° C. Then, about 100 g of dichlorosilane was slowly injected thereinto over the course of about one hour. While the resulting mixture was agitated, about 70 g of ammonia was slowly injected thereinto over the course of about 3 hours. Then, dry nitrogen was injected into the reactor for about 30 minutes to remove the remaining ammonia therein.

The prepared white slurry-phased product was filtered under dry nitrogen atmosphere using a 1 μm TEFLON (tetrafluoroethylene) filter, preparing about 1,000 g of a filtered solution. A solvent was three times repetitively substituted from pyridine to di-n-butylether using a rotary evaporator by adding dry di-n-butylether to adjust a solid content to 20%. The resulting product was filtered using a TEFLON (tetrafluoroethylene) filter with a pore size of 0.03 μm.

The obtained hydrogenated polysilazane solution had a weight average molecular weight, reduced to polystyrene, of 1,600, an N/Si mole ratio of 0.98, and a $SiH_3/SiH$ (total) ratio of 0.21. Herein, "SiH (total)" refers to a total of $SiH_e$, where e is an integer of 1 to 3.

The weight average molecular weight was measured using gel permeation chromatography (GPC) (HPLC Pump 1515, RI Detector 2414 (made by Waters Ltd.) and Column: KF801, KF802, KF803 (made by Shodex Inc.)). The N/Si mole ratio was measured using X-ray photoelectron spectroscopy (XPS) (JPS-9010 (made by JEOL Ltd.)). The $SiH_3/SiH$ (total) ratio was measured using a 300 MHz proton NMR: (AC-200 (made by Bruker Co.)).

Comparative Example 2

Dry nitrogen was filled inside a 2L reactor with an agitator and a temperature controller. 2.0 g of pure water was injected to 1,500 g of dry pyridine and sufficiently mixed therewith. The mixture was stored in the reactor and maintained at 5° C. Then, about 100 g of dichlorosilane was slowly injected thereinto over the course of about one hour. While the resulting mixture was agitated, about 70 g of ammonia was slowly injected thereinto for about 3 hours. Then, dry nitrogen was injected for about 30 minutes in the reactor to remove the remaining ammonia therein.

The prepared white slurry-phased product was filtered under dry nitrogen atmosphere using a 1 μm TEFLON (tetrafluoroethylene) filter, preparing about 1,000 g of a filtered solution. A solvent was three times repetitively substituted from pyridine to di-n-butylether using a rotary evaporator by adding dry di-n-butylether to adjust a solid content to 20%. The resulting product was filtered using a TEFLON (tetrafluoroethylene) filter with a pore size of 0.03 μm.

The obtained hydrogenated polysiloxazane had a weight average molecular weight, reduced to polystyrene, of 2,000, an N/Si mole ratio of 0.97, and a $SiH_3/SiH$ (total) ratio of 0.20. ("SiH (total)" refers to a total of $SiH_e$, where e is an integer of 1 to 3.)

Example 1

Dry nitrogen was substituted inside a 1L reactor with an agitator and a temperature controller. 100 g of a 20% di-n-butylether solution including the hydrogenated polysilazane obtained according to Comparative Example 1, 2.0 g of trisilylamine, and 300 g of dry pyridine were injected into the reactor and the reactor was filled with dry nitrogen therein. Subsequently, the resultant was heated slowly using an oil bath, and was kept at a temperature of 100° C. for 5 hours, and then was cooled to room temperature. A solvent was three times repetitively substituted from pyridine to di-n-butylether using a rotary evaporator by adding dry di-n-butylether to adjust a solid content to 20%. The resulting product was filtered using a TEFLON (tetrafluoroethylene) filter with a pore size of 0.03 μm.

The hydrogenated polysilazane-based compound solution had a weight average molecular weight of 3,000, an N/Si (mole ratio) of 0.93, and a $SiH_3/SiH$ (total) ratio of 0.48. ("SiH (total)" refers to a total of $SiH_e$, where e is an integer of 1 to 3.)

Example 2

Dry nitrogen was filled inside a 1L reactor with an agitator and a temperature controller. 100 g of a 20% di-n-butylether solution including the hydrogenated polysilazane obtained according to Comparative Example 2, 2.0 g of trisilylamine, and 300 g of dry pyridine were injected to the reactor and the reactor was substituted with dry nitrogen therein. Subsequently, the resultant was heated slowly using an oil bath, and was kept at a temperature of 100° C. for 5 hours, and then was cooled to room temperature. A solvent was three times repetitively substituted from pyridine to di-n-butylether using a rotary evaporator by adding dry di-n-butylether to adjust a solid content to 20%. The resulting product was filtered using a TEFLON (tetrafluoroethylene) filter with a pore size of 0.03 μm.

The hydrogenated polysilazane-based compound solution had a weight average molecular weight of 3,500, an N/Si mole ratio of 0.92, and a $SiH_3/SiH$ (total) ratio of 0.46. ("SiH (total)" refers to a total of $SiH_e$, where e is an integer of 1 to 3.)

Example 3

Dry nitrogen was filled inside a 1L reactor with an agitator and a temperature controller. 100 g of a 20% di-n-butylether solution including the hydrogenated polysilazane obtained according to Comparative Example 2, 4.0 g of trisilylamine, and 300 g of dry pyridine were injected to the reactor and the reactor was substituted with dry nitrogen therein. Subsequently, the resultant was heated slowly using an oil bath, and was kept at a temperature of 100° C. for 5 hours, and then was cooled to room temperature. A solvent was three times repetitively substituted from pyridine to di-n-butylether using a rotary evaporator by adding dry di-n-butylether to adjust a solid content to 20%. The resulting product was filtered using a TEFLON (tetrafluoroethylene) filter with a pore size of 0.03 μm.

The hydrogenated polysilazane-based compound solution had a weight average molecular weight of 4,000, an N/Si mole ratio of 0.90, a $SiH_3/SiH$ (total) ratio of 0.63. ("SiH (total)" refers to a total of $SiH_e$, where e is an integer of 1 to 3.)

Measurement of Shrinkage Ratio of Film Thickness

The compounds according to Examples 1 to 3 and Comparative Examples 1 to 2 were respectively coated onto silicon wafers at 1,500 rpm for 20 seconds with a spin coater. The coated silicon wafer was dried at 100° C. for 5 minutes and heated at 500° C. for 1 hour under an oxygen atmosphere having a vapor partial pressure of 5 kPa. The shrinkage ratios of the film thicknesses of each compound before and after the heating were calculated according to the following Equation 1, and the results are provided in the following Table 1.

Shrinkage ratio of film thickness (%)=$(T_1-T_2)/T_1 \times 100$, where: [Equation 1]

$T_1$ denotes a film thickness before heating at 500° C.; and $T_2$ denotes a film thickness after heating at 500° C.

Herein, the film thickness was measured using a spectral reflectance film thickness meter; ST-4000 (K-MAC Technology Corp.).

TABLE 1

|  | Thickness before heating (Å) | Thickness after heating (Å) | Shrinkage ratio of film thickness (%) |
|---|---|---|---|
| Comparative Example 1 | 6463 | 5,538 | 14.3% |
| Comparative Example 2 | 6389 | 5,462 | 14.5% |
| Example 1 | 6395 | 5,595 | 12.5% |
| Example 2 | 6274 | 5,527 | 11.9% |
| Example 3 | 6389 | 5,667 | 11.3% |

As shown in Table 1, the hydrogenated polysilazane-based compound and the hydrogenated polysiloxazane-based compound represented by the above Chemical Formula 1 according to Examples 1 to 3 had a low shrinkage ratio of a film thickness, while the compounds according to Comparative Examples 1 and 2 had a higher shrinkage ratio.

By way of summation and review, when a capacitor is formed to have an increased vertical area, a filler may be used to fill a gap formed in a mold during a process of forming an electrode of the capacitor. The electrode may be relatively high compared with a small horizontal area.

Embodiments disclosed herein may provide a filler for filling a gap in a mold. such a filler may be capable of reducing a shrinkage ratio during a conversion of the filler into silica layer. Another embodiment provides a method of preparing a filler for filling a gap. Yet another embodiment provides a method of manufacturing a semiconductor capacitor using the filler for filling a gap. The filler for filling a gap and the method of manufacturing a semiconductor capacitor using the same may be capable of preventing or reducing contraction during a heat treatment of the filler. The filler may have excellent filling properties for a gap with a small width and thus, filling a minute gap. The filler may be uniformly and densely filled with no air void or tiny gap and may provide excellent flatness on the surface of a layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A filler for filling a gap, the filler comprising a compound represented by the following Chemical Formula 1:

$Si_aN_bO_cH_d$     [Chemical Formula 1]

wherein, in Chemical Formula 1,
a, b, c, and d represent relative amounts of Si, N, O, and H, respectively, in the compound,
1.96<a<2.68,
1.78<b<3.21,
0≤c<0.19, and
4<d<10,
wherein the compound represented by Chemical Formula 1 includes —$SiH_e$, (wherein, e is an integer of 1 to 3), and
in the compound represented by Chemical Formula 1 including —$SiH_e$, a ratio of —$SiH_3$ to a total of —$SiH_e$ based on a total number of hydrogen atoms is about 0.46 to about 0.85.

2. The filler for filling a gap as claimed in claim 1, wherein the compound represented by Chemical Formula 1 has a weight average molecular weight of about 1,000 to about 30,000.

3. The filler for filling a gap as claimed in claim 1, wherein the compound represented by Chemical Formula 1 includes nitrogen atoms and silicon atoms at a mole ratio (N/Si) of about 0.7 to about 0.95.

4. A method of preparing a filler for filling a gap, the method comprising reacting a compound selected from the group of hydrogenated polysilazane, hydrogenated polysiloxazane, and a combination thereof, with trisilylamine (($SiH_3)_3N$).

5. A method of manufacturing a semiconductor capacitor, the method comprising forming a mold with a gap on a semiconductor substrate;
forming a conductive layer on the semiconductor substrate and the mold;
applying a filler in the gap and on the conductive layer to form a filler layer;
heat-treating the filler layer to form silica in the filler layer;
developing a part of the filler layer filled in the gap to form a filler pattern;
removing a part of the conductive layer to form the first electrode;
removing the mold and the filler pattern;
forming a dielectric layer on the first electrode; and
forming a second electrode on the dielectric layer,
wherein the filler, before the heat treating of the filler layer, includes a compound represented by the following Chemical Formula 1:

$Si_aN_bO_cH_d$     [Chemical Formula 1]

wherein, in Chemical Formula 1,
a, b, c, and d represent relative amounts of Si, N, O, and H, respectively, in the compound,
1.96<a<2.68,
1.78<b<3.21,
0≤c<0.19, and
4<d<10,
wherein the compound represented by Chemical Formula 1 includes —$SiH_e$ (wherein, e is an integer of 1 to 3), and
in the compound represented by Chemical Formula 1 including —$SiH_e$, a ratio of —$SiH_3$ to a total of —$SiH_e$ based on a total number of hydrogen atoms is about 0.46 to about 0.85.

6. The method as claimed in claim 5, wherein the compound represented by Chemical Formula 1 has a weight average molecular weight of about 1,000 to about 30,000.

7. The method as claimed in claim 5, wherein the compound represented by Chemical Formula 1 includes nitrogen atoms and silicon atoms at a mole ratio (N/Si) of about 0.7 to about 0.95.

8. The method as claimed in claim 5, wherein the heat-treating of the filler layer to form silica in the filler layer includes:
   drying the filler layer at a temperature of about 50° C. to about 200° C., and heat-treating the filler layer under an oxygen atmosphere including vapor of not less than about 0.1 kPa at a temperature of about 200° C. to about 1,000° C.

* * * * *